(12) United States Patent
Tomura et al.

(10) Patent No.: US 8,163,599 B2
(45) Date of Patent: Apr. 24, 2012

(54) FLIP-CHIP MOUNTING METHOD, FLIP-CHIP MOUNTING APPARATUS AND TOOL PROTECTION SHEET USED IN FLIP-CHIP MOUNTING APPARATUS

(75) Inventors: Yoshihiro Tomura, Osaka (JP); Kentaro Kumazawa, Osaka (JP); Takayuki Higuchi, Osaka (JP); Koujiro Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/933,819

(22) PCT Filed: Mar. 30, 2009

(86) PCT No.: PCT/JP2009/001432
§ 371 (c)(1),
(2), (4) Date: Sep. 21, 2010

(87) PCT Pub. No.: WO2009/128206
PCT Pub. Date: Oct. 22, 2009

(65) Prior Publication Data
US 2011/0020983 A1  Jan. 27, 2011

(30) Foreign Application Priority Data
Apr. 18, 2008  (JP) .................................. 2008-108400

(51) Int. Cl.
*H01L 21/44* (2006.01)
(52) U.S. Cl. ................ 438/107; 438/108; 257/E21.568; 257/E21.57

(58) Field of Classification Search .................. 438/107, 438/108, 458; 257/E21.568, E21.57
See application file for complete search history.

(56) References Cited

U.S. PATENT DOCUMENTS

| | | | |
|---|---|---|---|
| 6,488,803 B2 * | 12/2002 | Kiuchi et al. ................. | 156/230 |
| 7,703,657 B2 | 4/2010 | Matsumura et al. | |
| 2004/0238115 A1 | 12/2004 | Matsuno et al. | |
| 2008/0011415 A1 * | 1/2008 | Kiuchi et al. ................. | 156/247 |
| 2008/0102284 A1 * | 5/2008 | Hong et al. ................... | 428/413 |
| 2008/0138458 A1 * | 6/2008 | Ozasa et al. ................. | 425/4 R |
| 2008/0160293 A1 * | 7/2008 | Arimitsu et al. .............. | 428/332 |
| 2009/0317633 A2 * | 12/2009 | Yamamoto .................... | 428/343 |

FOREIGN PATENT DOCUMENTS

| | | |
|---|---|---|
| EP | 1975994 | 10/2008 |
| JP | 2002-359264 | 12/2002 |
| JP | 2003-86635 | 3/2003 |
| JP | 2005-32952 | 2/2005 |
| JP | 2005-079453 | 3/2005 |
| JP | 2007-189100 | 7/2007 |
| JP | 2009-016544 | 1/2009 |

\* cited by examiner

*Primary Examiner* — Hsien Ming Lee
(74) *Attorney, Agent, or Firm* — Hamre, Schumann, Mueller & Larson, P.C.

(57) ABSTRACT

A flip-chip mounting apparatus has a shield film (18) on the side of a pressurizing film (10*b*) of a tool protection sheet (10). When a semiconductor chip (1) is heated and pressurized via the tool protection sheet (10), the pressurizing film (10*b*) is released from a mold by a sheet fixing jig (9), and is expanded by a pressurizing/heating tool (11) to abut against an insulating resin film (5) protruding from the periphery of the semiconductor chip (1) and cure the insulating resin film (5) with an external pressure being applied.

5 Claims, 13 Drawing Sheets (a)

(b)

(c)

FLIP-CHIP MOUNTING METHOD, FLIP-CHIP MOUNTING APPARATUS AND TOOL PROTECTION SHEET USED IN FLIP-CHIP MOUNTING APPARATUS

TECHNICAL FIELD

The present invention relates to a flip-chip mounting method and a flip-chip mounting apparatus.

BACKGROUND ART

In recent years, semiconductor apparatuses in which a bare semiconductor chip is directly mounted on a wiring board (bare chip mounting) have been demanded with needs for smaller and thinner electronic devices. In particular, semiconductor apparatuses in which a semiconductor chip is mounted with the circuit surface of the semiconductor chip flipped to face a wiring board (flip-chip mounting) have been demanded.

Conventionally, a flip-chip semiconductor apparatus is configured by mounting a semiconductor chip having an internal connection terminal such as a metal bump electrode on a wiring board with flip-chip connection.

The wiring board has wiring patterns formed on opposite surfaces thereof, and the wiring patterns are electrically connected through a via (through hole) or the like formed in the wiring board. The internal connection terminal of a semiconductor device is connected to one of the wiring patterns, and an external connection terminal such as a solder ball is connected to the other of the wiring patterns. In a region between the semiconductor device and the wiring board, where the internal connection terminal of the semiconductor device is connected to the wiring pattern, thermosetting resin such as epoxy resin is filled to protect the internal connection terminal.

As shown in FIG. 14(a), when a wiring board 101 is set on a base 100, and a semiconductor chip 102 is mounted on the wiring board 101, an anisotropic conductive adhesive film 103 is bonded on the semiconductor chip 102, and the semiconductor chip 102 is positioned in a flip-chip manner. Inside a thermocompression bonding head 104, elastomer having rubber hardness of 40 to 80 is set as a compression bonding portion 105.

Next, as shown in FIG. 14(b), the thermocompression bonding head 104 heats and pressurizes the top and side of the semiconductor chip 102 via the compression bonding portion 105, thereby allowing the anisotropic conductive adhesive film 103 to be pressurized and cured with a predetermined pressure difference. Specifically, a connecting portion between the wiring board 101 and the semiconductor chip 102 can be sufficiently pressurized, and a fillet portion around the semiconductor chip 102 can be also pressurized so as not to create a void.

Patent Document 1: Japanese Patent Application Laid-Open No. 2005-32952

DISCLOSURE OF THE INVENTION

Problems to be Solved by the Invention

However, since the semiconductor chip 102 is heated and pressurized by the thermocompression bonding head 104 via the compression bonding portion 105 of the elastomer, it takes time to increase a temperature because of low heat conduction from the thermocompression bonding head 104. Thus, it takes further time to cure the anisotropic conductive adhesive film 103 between the semiconductor chip 102 and the wiring board 101, which increases a production lead time.

Meanwhile, to previously increase the temperature of the elastomer of the compression bonding portion 105, the thermocompression bonding head 104 needs to be maintained at a considerably high temperature. Variations in the heat resistance and temperature of the elastomer cause various thicknesses, leading to uneven curing of the anisotropic conductive adhesive film 103.

Further, it is difficult to pressurize the thermocompression bonding head 104 and the semiconductor chip 102 in plane parallel, and it is difficult to evenly control the bump height of the semiconductor chip 102 with a load. Further, when the semiconductor chip 102 has a multi-pin structure, it is more difficult to control the bump height by controlling the load.

The present invention has an object to provide a flip-chip mounting method and a flip-chip mounting apparatus that reduce variations in the bump height of a semiconductor chip, allow for short-time curing while applying an external pressure to underfill resin between the semiconductor chip and a wiring board, and have high productivity in a short lead time.

Means for Solving the Problems

The present invention provides a flip-chip mounting method according to a first aspect, including, when placing thermosetting underfill resin between a semiconductor chip and a wiring board and flip-chip mounting the semiconductor chip on the wiring board: pressurizing and heating the semiconductor chip positioned with the thermosetting underfill resin placed between the wiring board and the semiconductor chip, from the upside of a tool protection sheet having a two-layer film structure made up of at least a base film and a pressurizing film; separating the pressurizing film from the tool protection sheet other than a pressurizing portion immediately above the semiconductor chip while curing the underfill resin under the semiconductor chip; and expanding the separated pressurizing film to abut against the underfill resin around the semiconductor chip and cure the underfill resin while pressurizing and heating the underfill resin to fix the semiconductor chip on the wiring board.

In a flip-chip mounting method according to a second aspect of the present invention, the tool protection sheet seals at least one of a solid, a liquid, and a gas between the base film and the pressurizing film in the first aspect. The solid is preferably foam, for example, the mixed resin of ether resin, ester urethane resin or a thermal expansion capsule, and an adhesive (acrylic resin, rubber resin, silicone adhesive), or REVALPHA. The liquid is preferably a volatile expansion material, for example, a solvent having a low boiling point such as ethanol or IPA. The gas is preferably an easily expandable gas in heating, for example, an inactive gas such as air (air, dry air) and nitrogen, or hydrogen.

The present invention provides a flip-chip mounting method according to a third aspect, including, when placing thermosetting underfill resin between a semiconductor chip and a wiring board and flip-chip mounting the semiconductor chip on the wiring board: pressurizing and heating the semiconductor chip positioned with the thermosetting underfill resin placed between the wiring board and the semiconductor chip, from the upside of a tool protection sheet having a three-layer film structure made up of a base film, a pressurizing film, and a shield film bonded to the pressurizing film; separating the pressurizing film from the tool protection sheet other than a pressurizing portion immediately above the semiconductor chip while curing the underfill resin under the semiconductor chip; expanding the separated pressurizing film to abut against the underfill resin around the semiconductor chip via the shield film and cure the underfill resin while pressurizing and heating the underfill resin to fix the semiconductor chip to the wiring board; and bonding the shield film on the side of the semiconductor chip.

In a flip-chip mounting method according to a fourth aspect of the present invention, the tool protection sheet seals at least one of a solid, a liquid, and a gas between the base film and the pressurizing film in the third aspect.

The present invention provides a tool protection sheet according to a fifth aspect having a two-layer film structure made up of at least a base film and a pressurizing film, wherein the pressurizing film at an unpressurized portion is separated from the base film and expanded when the tool protection sheet is heated.

The tool protection sheet according to a sixth aspect of the present invention seals at least one of a solid, a liquid, and a gas between the base film and the pressurizing film in the fifth aspect.

The present invention provides a tool protection sheet according to a seventh aspect having a three-layer film structure made up of at least a base film, a pressurizing film, and a shield film bonded to the pressurizing film, wherein the pressurizing film at an unpressurized portion is separated from the base film and expanded when the tool protection sheet is heated.

The tool protection sheet according to an eighth aspect of the present invention seals at least one of a solid, a liquid, and a gas between the base film and the pressurizing film in the seventh aspect.

The present invention provides a flip-chip mounting apparatus according to a ninth aspect that places thermosetting underfill resin between a semiconductor chip and a wiring board and flip-chip mounts the semiconductor chip on the wiring board, the flip-chip mounting apparatus including: a sheet fixing jig for holding a tool protection sheet having a two-layer film structure made up of at least a base film and a pressurizing film or a three-layer film structure made up of at least a base film, a pressurizing film, and a shield film bonded to the pressurizing film, and covering the semiconductor chip positioned with the thermosetting underfill resin placed between the wiring board and the semiconductor chip and an area around the semiconductor chip; and a pressurizing/heating tool for heating and pressing the semiconductor chip against the wiring board, the pressurizing/heating tool having a protrusion for pressing the tool protection sheet between the inner peripheral portion of the sheet fixing jig and the outer peripheral portion of the semiconductor chip against the outer peripheral portion of the thermosetting underfill resin.

Advantage of the Invention

With this configuration, the semiconductor chip is heated and pressurized via the tool protection sheet having the two-layer film structure or the three-layer film structure, the pressurizing film is separated from the tool protection sheet other than the pressurizing portion immediately above the semiconductor chip while curing the underfill resin under the semiconductor chip, and the separated pressurizing film is expanded to abut against the underfill resin around the semiconductor chip and cure the underfill resin while pressurizing and heating the underfill resin. Thus, a semiconductor device having high productivity and reliability can be produced in a short lead time.

BEST MODE FOR CARRYING OUT THE INVENTION

Figure 1:
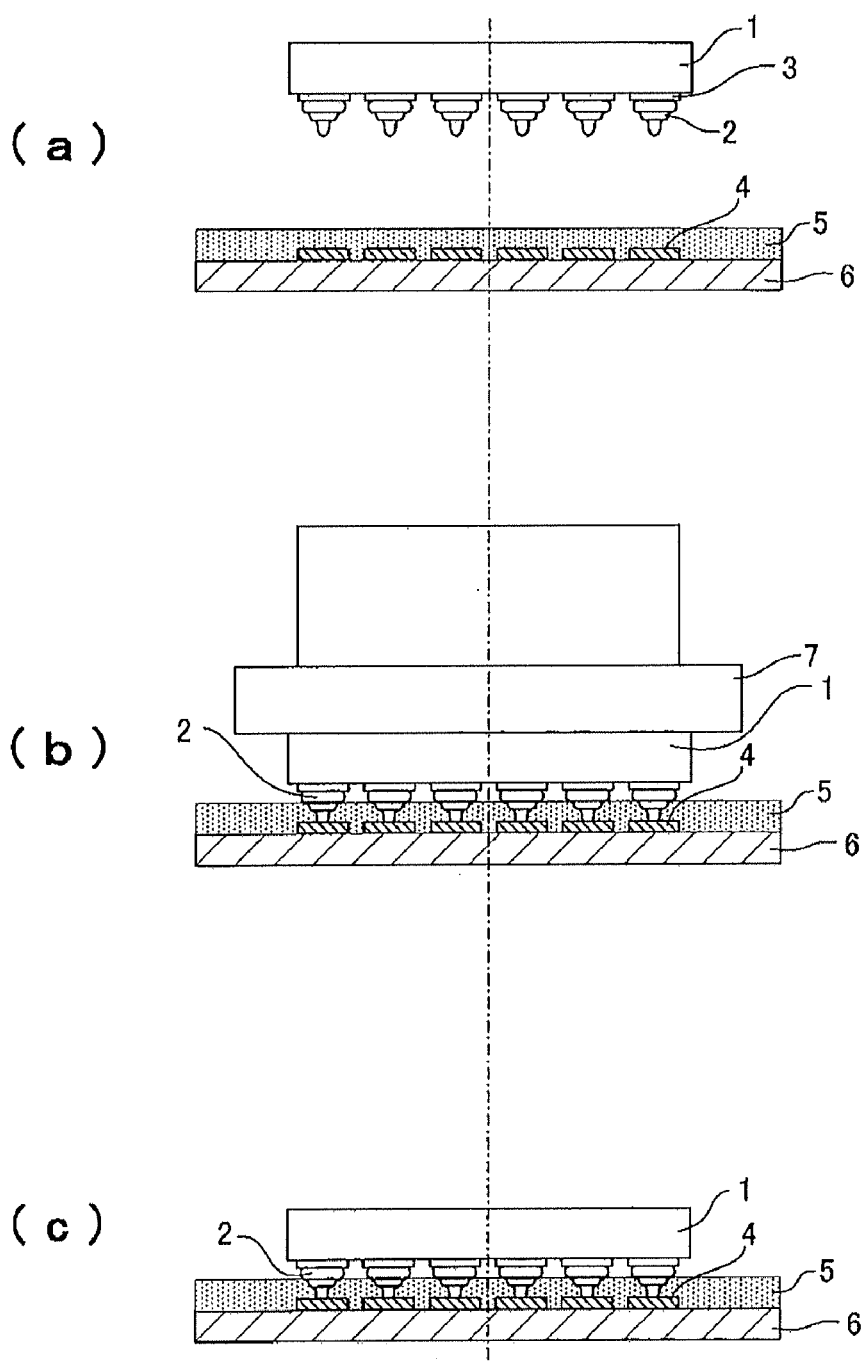
FIG. 1 shows an upstream process of Embodiment 1 of a flip-chip mounting method according to the present invention.

Now, a flip-chip mounting method according to the present invention will be described based on specific embodiments.
Embodiment 1

FIGS. 1, 2A, 2B and 3 show Embodiment 1 of the present invention.

A flip-chip mounting method of Embodiment 1 uses a tool protection sheet, and includes an upstream process shown in FIGS. 1(a) to 1(c) for positioning a semiconductor chip on a wiring board, and a downstream process shown in FIGS. 2A and 2B and FIGS. 3(a) to 3(e), performed after the upstream process, for pressing the semiconductor chip via the tool protection sheet.

As shown in FIG. 1(a), a bump 2 is provided on an electrode pad 3 of a semiconductor chip 1. The bump 2 may be a stud bump or a tear bump formed by known wire bonding or may be formed by plating or printing. The bump 2 is mainly formed of at least one of gold, copper, palladium, nickel, tin, aluminum, solder, and the like. A wire for forming the bump 2 may include or contain trace elements. A bump height in this case is about 50 μm.

A wiring board 6 is a glass epoxy board (may be an aramid board, a silicon board, or a silicon interposer) having a thickness of 0.2 to 0.4 mm. A terminal electrode is made of copper (may be plated with nickel and gold), and the semiconductor chip 1 has a thickness of 0.15 to 0.2 mm. The resin of an insulating resin film 5 is epoxy resin cured at 180° C. The insulating resin film 5 as underfill resin cut into a slightly larger size than the semiconductor chip 1 as required is bonded on a terminal electrode 4 of the wiring board 6.

Then, a semiconductor chip mounting/positioning device 7 sucks the semiconductor chip 1 with a tool, and positions the semiconductor chip 1 on desired positions of the terminal electrodes 4 on the wiring board 6 as shown in FIG. 1(b) with an identification mark or the like, and the bumps 2 of the semiconductor chip 1 are placed over the corresponding terminal electrodes 4. At this point, the bumps 2 pierce the insulating resin film 5. The bumps 2 partially pass through the insulating resin film 5, abut against the terminal electrodes 4, and are deformed. A positioning load is about 10 g per bump. The semiconductor chip mounting/positioning device 7 may be heated by a built-in heater, but the resin should not be cured 100%. After the semiconductor chip 1 is mounted, the semiconductor chip mounting/positioning device 7 is removed to provide a workpiece as shown in FIG. 1(c).

In FIG. 1(a), the wiring board 6 may be previously heated at about 50° C. or a tool (not shown) of a bonding device may be heated so that the insulating resin film 5 is bonded on the wiring board 6. A bonding load is 5 to 10 kgf/cm². The insulating resin film 5 has a thickness of 50 μm. If the insulating resin film 5 has two layers including a protective separator (not shown), the protective separator is removed. For the insulating resin of the insulating resin film 5, for example, epoxy resin, phenol resin, or polyimide may be used. For insulating thermoplastic resin, polyphenylene sulfide (PPS), polycarbonate, or modified polyphenylene oxide (PPO) may be used. Alternatively, a mixture of insulating thermosetting resin and insulating thermoplastic resin may be used. An inorganic filler amount is 50 wt %. The filler amount is determined by a stress caused by thermal expansion and warps of the semiconductor chip 1 and the wiring board 6. The filler amount is also determined by reliability due to moisture resistance and adhesion by a moisture absorption reflow test or an in-moisture bias test. The insulating resin film 5 preferably has reflow heat resistance (265° C., 10 seconds).

Figure 2A:
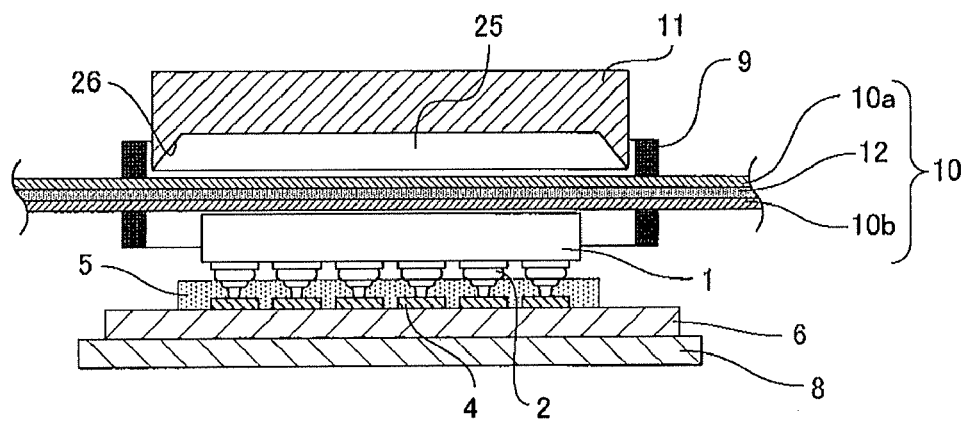
FIG. 2A is a sectional view of a first step of a downstream process of Embodiment 1.

In FIG. 2A, the workpiece shown in FIG. 1(c) is conveyed to a pressurizing/heating stage 8, and the back surface of the wiring board 6 is attached to the pressurizing/heating stage 8. A tool protection sheet 10 having a two-layer film structure is provided above the semiconductor chip 1, and a pressurizing/heating tool 11 is provided above the tool protection sheet 10. Reference numeral 9 is a sheet fixing jig for holding the tool protection sheet 10.

The tool protection sheet 10 has a base sheet 10a on the side of the pressurizing/heating tool 11, and the base sheet 10a is preferably a heat-resistant film. The base film 10a is preferably a heat-resistant film made of, for example, polyimide, polyphenylene sulfide, or fluororesin. The base film 10a has a thickness of about 5 to 10 μm. The tool protection sheet 10 has a pressurizing film 10b on the side of the semiconductor chip 1, and the pressurizing film 10b is also preferably a heat-resistant film (NCF curing temperature). The pressurizing film 10b is preferably made of, for example, polyimide, polyphenylene sulfide, or fluororesin. The pressurizing film 10b has a thickness of about 5 to 10 μm.

A solvent 12 as a liquid is sealed between the base film 10a and the pressurizing film 10b. A preferable solvent 12 is a solvent of a volatile expansion material having a low boiling point such as ethanol or IPA because of its expandability.

Figure 2B:
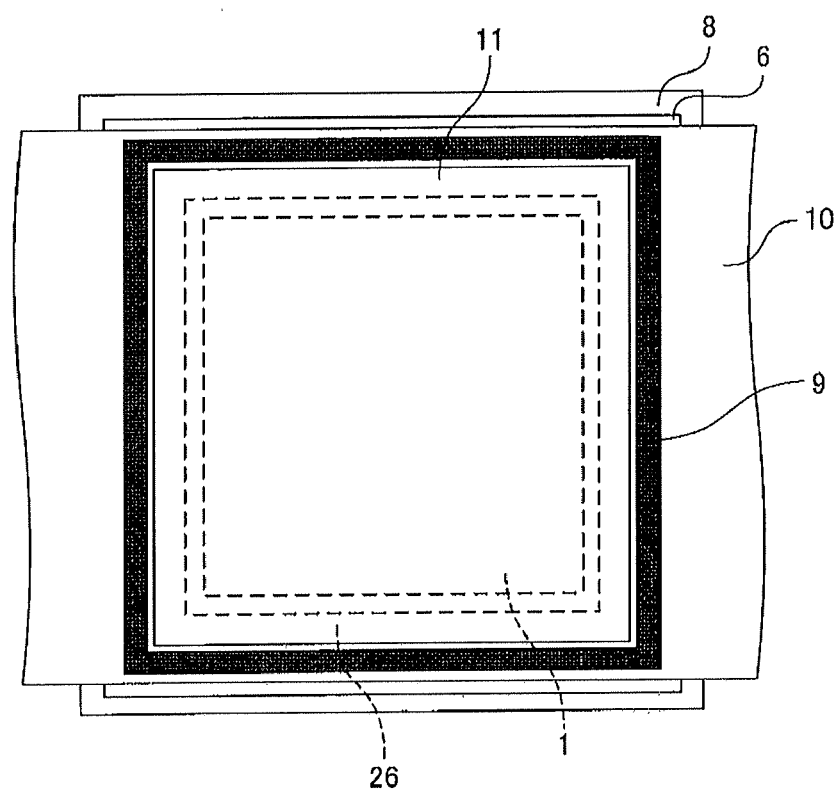
FIG. 2B is a partially cut-away plan view of the first step of the downstream process of Embodiment 1.
Figure 3:
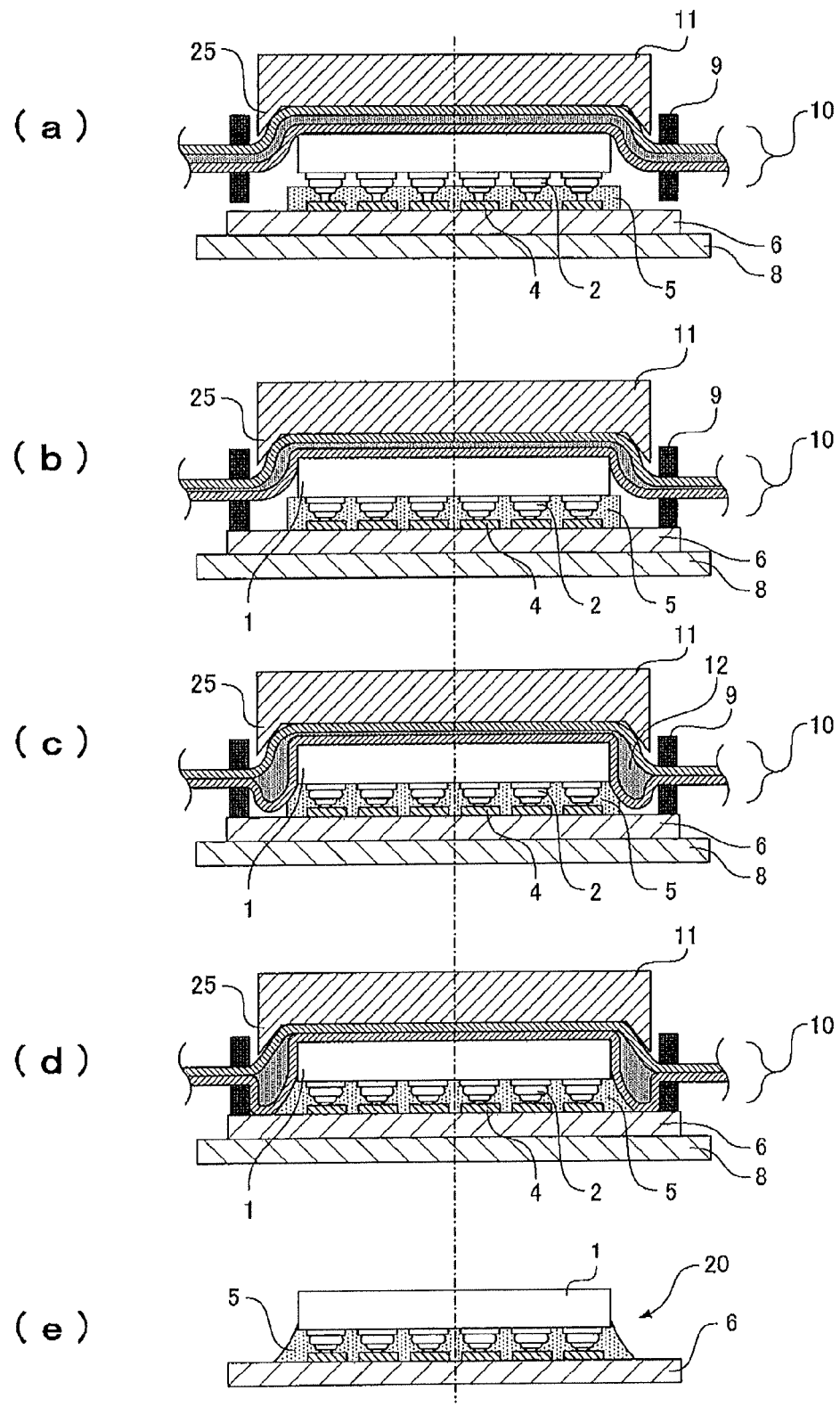
FIG. 3 is a process diagram of the downstream process of Embodiment 1.

The pressurizing/heating tool 11 has a protrusion 25 for heating and pressing the semiconductor chip 1 against the wiring board 6, and pressing the tool protection sheet 10 between the inner peripheral portion of the sheet fixing jig 9 and the outer peripheral portion of the semiconductor chip 1 against the outer peripheral portion of the thermosetting insulating resin film 5. The temperature is set to 210° C. so that heat is transferred to the semiconductor chip 1 via the tool protection sheet 10 and a curing temperature of 180° C. of the insulating resin film 5 is reached. A constant heating type tool is herein used, but a ceramic high speed temperature increasing type tool may be used. FIG. 2B is a plan view seen from the side of the pressurizing/heating tool 11. The sheet fixing jig 9 clamps and fixes the tool protection sheet 10.

The protrusion 25 is thus annularly formed on the outer periphery of the pressurizing/heating tool 11, thereby allowing heat of the pressurizing/heating tool 11 to be more quickly transferred to the tool protection sheet 10.

Next, in FIG. 3(a), the sheet fixing jig 9 lowers the tool protection sheet 10 so as to be in contact with the semiconductor chip 1, and the pressurizing/heating tool 11 presses and holds the tool protection sheet 10 against the semiconductor chip 1 to pressurize and heat the semiconductor chip 1.

In FIG. 3(b), the pressurizing/heating tool 11 applies a load, so that all the bumps 2 pierce the insulating resin film 5 and are deformed in contact with the terminal electrode 4 on the wiring board 6. A portion of the tool protection sheet 10 held by the sheet fixing jig 9 and pressed against the semiconductor chip 1, which is between the inside of the sheet fixing jig 9 and the outer peripheral portion of the semiconductor chip 1, is inclined to near the wiring board 6.

In FIG. 3(c), in the tool protection sheet 10, the solvent 12 between the base film 10a and the pressurizing film 10b is heated by heat from the pressurizing/heating tool 11 and vaporized and expanded.

In FIG. 3(d), the solvent 12 between the base film 10a and the pressurizing film 10b is further expanded. Further, the pressurizing/heating tool 11 brings the height of the bump 2 of the semiconductor chip 1 close to a desired value. The pressurizing film 10b is expanded in a space surrounded by the pressurizing/heating tool 11, the sheet fixing jig 9 and the wiring board 6, the insulating resin film 5 protruding from the end of the semiconductor chip 1 is laterally pressed while a fillet portion 19 around the semiconductor chip 1 is pressurized, and the insulating resin film 5 is cured while an inner pressure with the insulating resin film 5 under the semiconductor chip 1 being pressurized and heated is controlled by an external pressure by the pressurizing film 10b.

A deformation load at this point is about 50 g per bump. The load is controlled depending on the size of the bump 2, and in this case, the bump height is 25 μmt. As required, the pressurizing/heating stage 8 may be heated or cooled to control the inner pressure applied to the insulating resin film 5 to suppress generation of a void.

FIG. 3(e) shows a flip-chip mounting body obtained by releasing the pressurizing/heating tool 11 after the insulating resin film 5 is cured by the external pressure by the pressurizing film 10b.

As described above, pressurizing and heating with the thin tool protection sheet 10 allow heat to be easily transferred to the semiconductor chip 1 and its surrounding area and allow the insulating resin film 5 to be cured, and the thin tool protection sheet 10 allows the pressurizing/heating tool 11 to apply an even load in a parallel fashion to and pressurize the semiconductor chip 1 to cure the insulating resin film 5 in a short lead time. Further, the solvent 12 is vaporized and expanded, so that the pressurizing film 10b can be pressed against the insulating resin film to apply the external pressure to and cure the insulating resin film 5.

The tool protection sheet 10 is a thin sheet and flexibly bendable in contrast to rubber, and the fillet portion 19 of the insulating resin film 5 around the semiconductor chip 1 can be reduced to suppress the generation of a void.

Instead of the insulating resin film 5, an anisotropic conductive film (ACF) may be used, and further, gold-plated nickel powder is used as conductive particles (not shown) contained in the anisotropic conductive film, thereby reducing connection resistance between the terminal electrode 4 and the bump 2 to obtain satisfactory connection reliability. Further, the conductive particles may be nickel- or gold-plated resin balls. Moreover, fine particles such as solder may be used as the conductive particles to obtain connection in an alloy state from connection in a contact state between the terminal electrode 4 and the bump 2, thereby further improving connection reliability.

The wiring board 6 is a single-sided, double-sided, or multilayer plate, and the terminal electrode 4 corresponding to the bump 2 of the semiconductor chip 1 is formed on the surface of the wiring board 6. The wiring board 6 may be a ceramic board, a resin board, a resin flexible sheet (such as polyimide flexible sheet), or a silicon board.

The insulating resin film 5 may be formed by bonding a film in a B stage (semisolid state) of epoxy resin. The insulating resin film 5 may be formed by applying paste or printing. The insulating resin film 5 may contain inorganic (silica) filler. The filler amount can be controlled to change the bonding property, thermal expansion, and elastic modulus of the insulating resin film 5 to obtain mass productivity and reliability. The filler amount is herein 50 wt %.

The solvent 12 is not limited to a liquid, but may be mixed in an adhesive.

Embodiment 2

Figure 4:
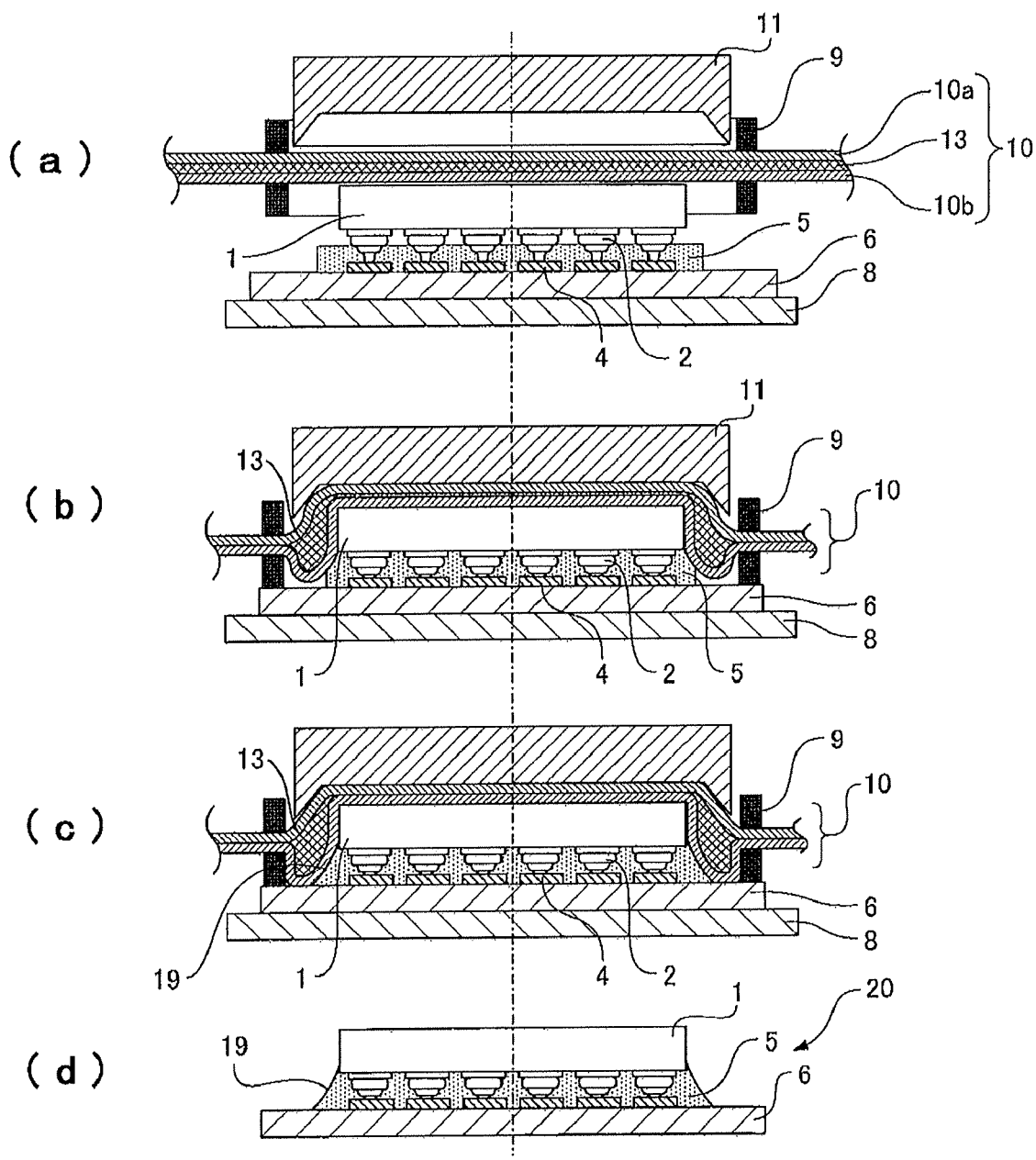
FIG. 4 shows a downstream process of Embodiment 2 of the flip-chip mounting method according to the present invention.

FIGS. 1 and 4 show Embodiment 2 of the present invention.

In the flip-chip mounting method of Embodiment 1, the liquid solvent 12 is sealed or mixed in an adhesive between the base film 10a and the pressurizing film 10b of the tool protection sheet 10 in FIG. 2A. Embodiment 2 is different from Embodiment 1 in that foam 13 is provided instead of the solvent 12 as shown in FIG. 4(a) between a base film 10a and a pressurizing film 10b of a tool protection sheet 10. Others are the same as in Embodiment 1.

Subsequently to the procedure in FIG. 1, in FIG. 4(a), the workpiece shown in FIG. 1(c) is conveyed to a pressurizing/heating stage 8, and the back surface of a wiring board is attached to the pressurizing/heating stage 8. The tool protection sheet 10 held by a sheet fixing jig 9 is provided above the semiconductor chip 1.

The tool protection sheet 10 has a two-layer film structure made up of the base film 10a and the pressurizing film 10b, and the foam 13 as a solid is formed between the base film 10a and the pressurizing film 10b. For example, the mixed resin of ether resin, ester urethane resin, or a thermal expansion capsule and an adhesive (acrylic resin, rubber resin, a silicone adhesive), or REVALPHA is preferable.

The foam 13 may contain particles that provide a reduction effect of a bonding area with an adherend due to an increase in surface roughness via the expansion and foaming of thermal expansion fine particles by heating, or a generation effect of a release stress on an adhesive interface due to surface expansion, and reduce or eliminate an adhesive force to the adherend. The thermal expansion capsule is a microcapsule in which a foaming agent is contained in the outer shell of copolymerized barrier thermoplastic resin, and when the thermal expansion capsule is heated, the outer shell is softened and expanded by the vaporization pressure of the foaming agent. For example, the microsphere produced by KUREHA CORPORATION may be used. See Japanese Patent No. 2898480. A thermal expansion microcapsule may be used in which a volatile expanding agent gasified at high temperature is microcapsulated.

The foam 13 is preferably a thermal release sheet that has an adhesive force at room temperature and is expanded and released at low temperature (specifically, REVALPHA (Thermal Release Tape REVALPHA) manufactured by NITTO DENKO CORPORATION, or the like). The foam may be a liquid, semi-solid, or solid.

The foam 13 may be mixed with an adhesive and bonded to the base film 10a and the pressurizing film 10b, or the side of the pressurizing film 10b may be easily released and a closed space containing a gas may be formed between the base film 10a and the pressurizing film 10b. The foam 13 may be mixed with an acrylic, rubber, or silicone adhesive.

A pressurizing/heating tool 11 is set to 210° C. so that heat is transferred via the tool protection sheet 10 to a semiconductor chip 1, and further a curing temperature of 180° C. of an insulating resin film 5 is reached.

Next, in FIG. 4(b), the sheet fixing jig 9 clamps and lowers the tool protection sheet 10 so as to be in contact with the semiconductor chip 1, and the pressurizing/heating tool 11 presses and holds the tool protection sheet 10 against the semiconductor chip 1 to pressurize and heat the semiconductor chip 1.

The pressurizing/heating tool 11 applies a load, so that all bumps 2 pierce the insulating resin film 5 and are deformed in contact with a terminal electrode 4 on a wiring board 6. The tool protection sheet 10 is inclined to near the wiring board 6 by the sheet fixing jig 9. At this point, the outer periphery of the pressurizing/heating tool 11 may be inclined toward the insulating resin film 5 to form a fillet portion 19 around the semiconductor chip 1 as in FIG. 4(a). Inclination 26 is provided to allow heat from the pressurizing/heating tool 11 to be more quickly transferred to the tool protection sheet 10.

The pressurizing/heating tool 11 is brought close to or into contact with the tool protection sheet 10 to heat the tool protection sheet 10, and thus the foam 13 is heated by heat from the pressurizing/heating tool 11 and foamed and expanded.

In FIG. 4(c), the pressurizing/heating tool 11 is further lowered to heat the tool protection sheet 10, and thus the foam 13 is further expanded. The sheet fixing jig 9 clamps and fixes the tool protection sheet 10. The pressurizing/heating tool 11 brings the height of the bump 2 of the semiconductor chip 1 close to a desired value. The foam 13 is expanded in a space surrounded by the pressurizing/heating tool 11, the sheet fixing jig 9, and the wiring board 6 to expand the pressurizing film 10b, the insulating resin film 5 to form the fillet portion 19 protruding from the end of the semiconductor chip 1 is laterally pressurized and cured, and the insulating resin film 5 is cured while an inner pressure with the insulating resin film 5 under the semiconductor chip 1 being pressurized and heated is controlled by an external pressure by the pressurizing film 10b. The deformation load of the bump 2 is about 50 g per bump. The load is controlled depending on the size of the bump 2, and in this case, the bump height is 25 μmt in view of reliability. As required, the pressurizing/heating stage 8 may be heated or cooled to control the inner pressure applied to the insulating resin film 5 to suppress generation of a void.

FIG. 4(d) shows a flip-chip mounting body obtained by releasing the pressurizing/heating tool 11 after the insulating resin film 5 is cured by the external pressure by the pressurizing film 10b.

As described above, pressurizing and heating with the thin tool protection sheet 10 allow heat to be easily transferred to the semiconductor chip 1 and its surrounding area and allow the insulating resin film 5 to be cured, and the thin tool protection sheet 10 allows the pressurizing/heating tool 11 to apply an even load in a parallel fashion to and pressurize the semiconductor chip 1. The insulating resin film 5 can be cured in a short lead time. Further, the foam 13 is vaporized and expanded, and thus the pressurizing film 10b can be pressed against the insulating resin film 5 to apply the external pressure to and cure the insulating resin film 5. Thus, the tool protection sheet 10 is a thin sheet and flexibly bendable in contrast to rubber, and the fillet portion 19 of the insulating resin film 5 around the semiconductor chip 1 can be reduced to suppress the generation of a void.

Embodiment 3

Figure 5:
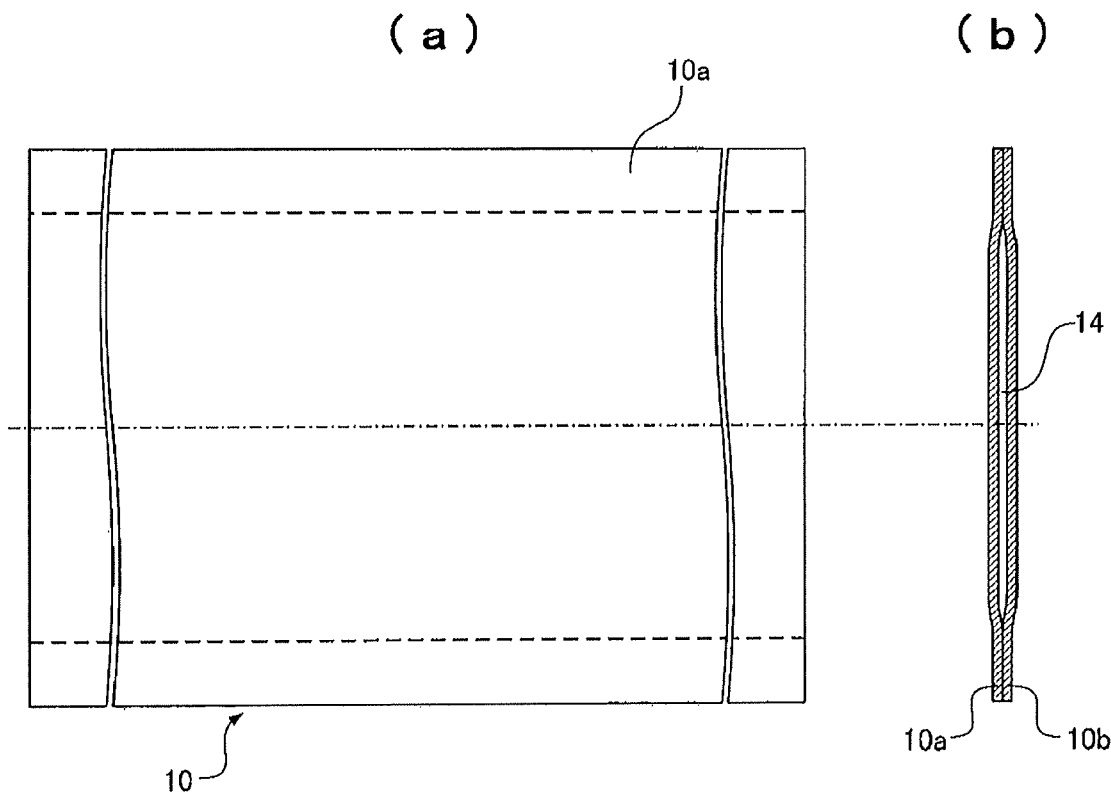
FIG. 5 is a plan view and a sectional view of a tool protection sheet used in Embodiment 3 of the flip-chip mounting method according to the present invention.
Figure 6:
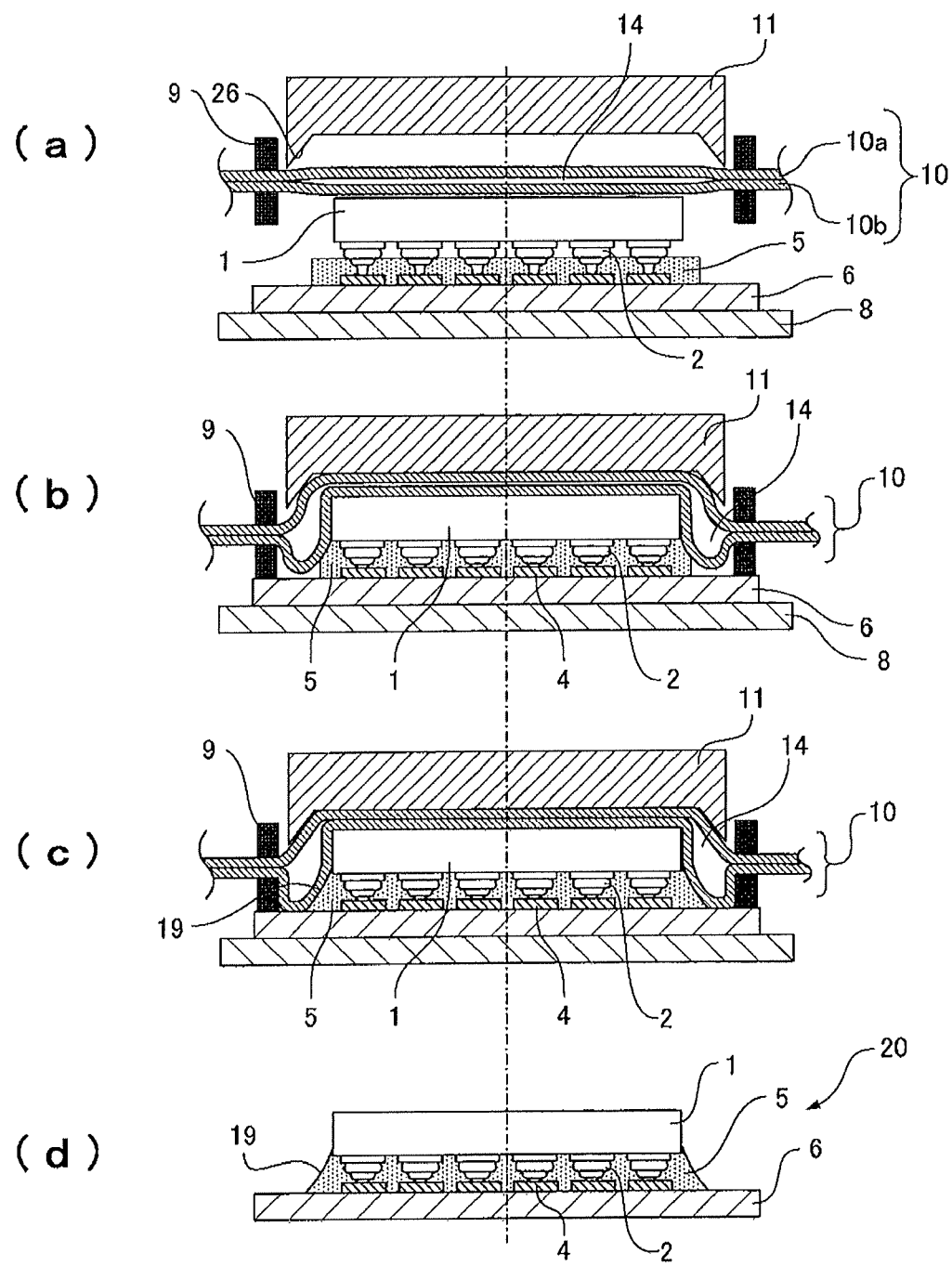
FIG. 6 is a process diagram of a downstream process of Embodiment 3.

FIGS. 1, 5 and 6 show Embodiment 3 of the present invention.

In the flip-chip mounting method of Embodiment 1, the liquid solvent 12 is sealed or mixed in an adhesive between the base film 10a and the pressurizing film 10b of the tool protection sheet 10 in FIG. 2A. As shown in FIGS. 5(a) and 5(b), Embodiment 3 is different from Embodiment 1 in that gas is held instead of the solvent 12 between a base film 10a and a pressurizing film 10b of a tool protection sheet 10, and a closed space 14 is formed in the tool protection sheet 10. Others are the same as in Embodiment 1.

The gas forming the closed space 14 of the tool protection sheet 10 may be gas easily expandable in heating such as general air, dry air, inactive gas such as nitrogen, and hydrogen. The long sides of the base film 10a and the pressurizing film 10b may be closed by lamination-fusion by heat at a process temperature or more or by a heat-resistant adhesive or the like so that a bag shape can be maintained during heating.

In FIG. 6(a), the workpiece shown in FIG. 1(c) is conveyed to a pressurizing/heating stage 8, and the back surface of a wiring board is attached to the pressurizing/heating stage 8. The tool protection sheet 10 held by a sheet fixing jig 9 is provided above a semiconductor chip 1. Further, a pressurizing/heating tool 11 is provided above the tool protection sheet 10.

In FIG. 6(b), the sheet fixing jig 9 clamps and lowers the tool protection sheet 10 so as to be in contact with the semiconductor chip 1, and the pressurizing/heating tool 11 presses and holds the tool protection sheet 10 against the semiconductor chip 1 to pressurize and heat the semiconductor chip 1. The closed space 14 held between the base film 10a and the pressurizing film 10b of the tool protection sheet 10 is pressed by the pressurizing/heating tool 11 and expanded around the semiconductor chip 1.

The pressurizing/heating tool 11 applies a load, so that all bumps 2 pierce an insulating resin film 5 and are deformed in contact with a terminal electrode 4 on a wiring board 6. The tool protection sheet 10 is inclined to near the wiring board 6 by the sheet fixing jig 9.

At this point, the outer periphery of the pressurizing/heating tool 11 may be inclined toward the insulating resin film 5 to form a fillet portion 19 around the semiconductor chip 1 as in FIG. 6(b). Inclination 26 is provided to allow heat from the pressurizing/heating tool 11 to be more quickly transferred to the tool protection sheet 10.

The pressurizing/heating tool 11 is brought close to or into contact with the tool protection sheet 10 to heat the tool protection sheet 10, and thus the closed space 14 is heated by heat from the pressurizing/heating tool 11 and expanded.

In FIG. 6(c), the pressurizing/heating tool 11 is further lowered to heat the tool protection sheet 10, and thus the closed space 14 is further thermally expanded. The sheet fixing jig 9 clamps and fixes the tool protection sheet 10, and the pressurizing/heating tool 11 brings the height of the bump 2 of the semiconductor chip 1 close to a desired value.

The closed space 14 is expanded in a space surrounded by the pressurizing/heating tool 11, the sheet fixing jig 9 and the wiring board 6 to expand the pressurizing film 10b, the insulating resin film 5 protruding from the end of the semiconductor chip 1 to form the fillet portion 19 is laterally pressurized and cured, and the insulating resin film 5 is cured while an inner pressure with the insulating resin film 5 under the semiconductor chip 1 being pressurized and heated is controlled by an external pressure by the pressurizing film 10b. The deformation load of the bump 2 is about 50 g per bump. The load is controlled depending on the size of the bump 2, and in this case, the bump height is 25 μmt in view of reliability. As required, the pressurizing/heating stage 8 may be heated or cooled to control the inner pressure applied to the insulating resin film 5 to suppress generation of a void.

FIG. 6(d) shows a flip-chip mounting body obtained by releasing the pressurizing/heating tool 11 after the insulating resin film 5 is cured by the external pressure by the pressurizing film 10b.

As described above, pressurizing and heating with the thin tool protection sheet 10 allow heat to be easily transferred to the semiconductor chip 1 and its surrounding are and allow the insulating resin film 5 to be cured, and the thin tool protection sheet 10 allows the pressurizing/heating tool 11 to apply an even load in a parallel fashion from above to and pressurize the semiconductor chip 1. Further, the insulating resin film 5 can be cured in a short lead time. Moreover, the closed space 14 is vaporized and expanded, and thus the pressurizing film 10b can be pressed against the insulating resin film 5 to apply the external pressure to and cure the insulating resin film 5. The tool protection sheet 10 is a thin sheet and flexibly bendable in contrast to rubber, and the fillet portion 19 of the insulating resin film 5 around the semiconductor chip 1 can be reduced to suppress the generation of a void.

Embodiment 4

Figure 7:
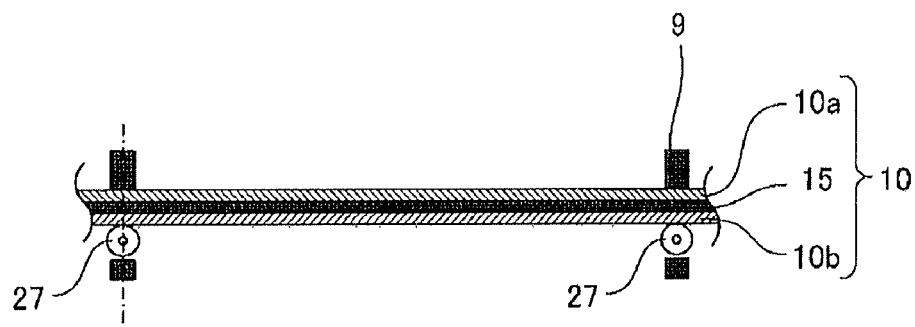
FIG. 7 is a sectional view of a tool protection sheet used in Embodiment 4 of the flip-chip mounting method according to the present invention.
Figure 7:
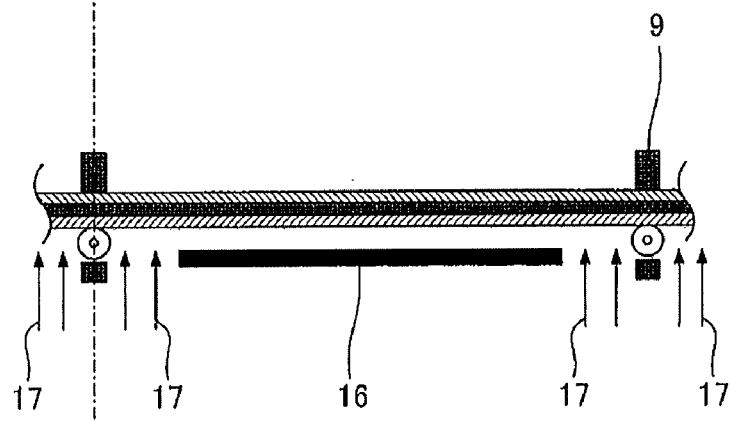
Figure 7:
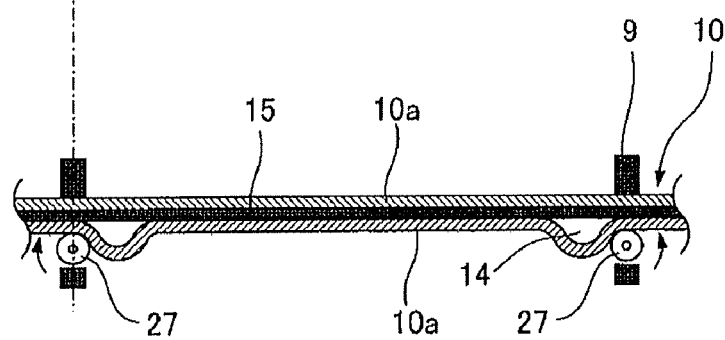
Figure 8:
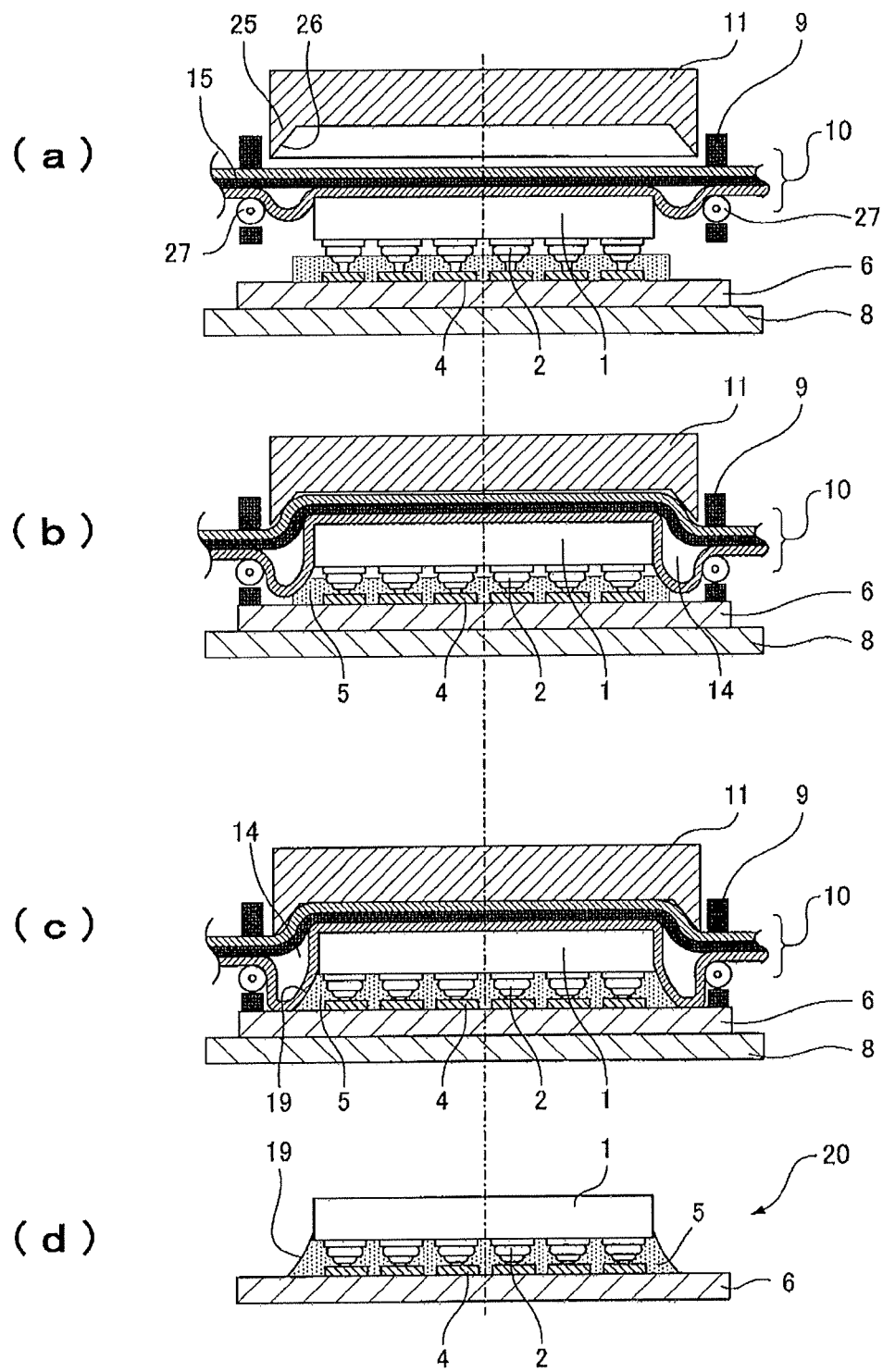
FIG. 8 is a process diagram of a downstream process of Embodiment 4.

FIGS. 1, 7 and 8 show Embodiment 4 of the present invention.

In the flip-chip mounting method of Embodiment 1, the liquid solvent 12 is sealed or mixed in an adhesive between the base film 10a and the pressurizing film 10b of the tool protection sheet 10 in FIG. 2A. As shown in FIG. 7(a), in Embodiment 4, an UV curable adhesive 15 is formed instead of the solvent 12 between a base film 10a and a pressurizing film 10b of a tool protection sheet 10. An UV-cutoff light blocking film is used as the base film 10a, and only the used part of the tool protection sheet 10 is exposed from a guide.

In FIG. 7(b), UV light 17 is applied to the pressurizing film 10b in a state where a light blocking mask 16 is placed so that the UV light is not incident on a portion substantially in contact with the back surface of a semiconductor chip 1 from the side of the pressurizing film 10b in contact with the back surface of the semiconductor chip 1. Thus, the UV curable adhesive 15 is partially cured, and the adhesive force of the cured part is reduced to allow the pressurizing film 10b to be easily released from the base film 10a.

In FIG. 7(c), a roller 27 in contact with the side of the pressurizing film 10b of a sheet fixing jig 9 is rotated inward to wind and draw the pressurizing film 10b, and thus the pressurizing film 10b is partially released from the base film 10a to provide slack in the film toward the middle of the tool protection sheet. The pressurizing film 10b is preferably a light transmissive film so that the UV curable adhesive is easily released. The thickness or adhesive force of the UV curable adhesive may be selected and controlled so that a closed space is easily formed by the film releasing operation of the sheet fixing jig.

In FIG. 8(a), the workpiece shown in FIG. 1(c) is conveyed to a pressurizing/heating stage 8, and the back surface of a wiring board is attached to the pressurizing/heating stage 8. Provided above the semiconductor chip 1 is the tool protection sheet 10 in which the UV curable adhesive 15 shown in FIG. 7(c) is released and a closed space 14 is formed, and a pressurizing/heating tool 11 is provided above the tool protection sheet 10.

In FIG. 8(b), the sheet fixing jig 9 clamps and lowers the tool protection sheet 10 so as to be in contact with the semiconductor chip 1, and the pressurizing/heating tool 11 presses and holds the tool protection sheet 10 against the semiconductor chip 1 to pressurize and heat the semiconductor chip 1. The slack in the pressurizing film 10b is formed as a bulge around the semiconductor chip 1. The pressurizing/heating tool 11 applies a load, so that all bumps 2 pierce an insulating resin film 5 and are deformed in contact with a terminal electrode 4 on a wiring board 6.

The tool protection sheet 10 is inclined to near the wiring board 6 by the sheet fixing jig 9. At this point, it is preferable that a protrusion 25 is provided on the outer periphery of the pressurizing/heating tool 11, and inclination 26 is provided toward the insulating resin film 5 to form a fillet portion 19 around the semiconductor chip 1. The inclination 26 is provided to allow heat from the pressurizing/heating tool 11 to be more quickly transferred to the tool protection sheet 10.

The pressurizing/heating tool 11 is brought close to or into contact with the tool protection sheet 10 to heat the tool protection sheet 10, and thus the closed space 14 between the base film 10a and the pressurizing film 10b is heated by heat from the pressurizing/heating tool 11 and expanded.

In FIG. 8(c), the pressurizing/heating tool 11 is further lowered to heat the tool protection sheet 10, and thus the closed space 14 between the base film 10a and the pressurizing film 10b is further thermally expanded. The sheet fixing jig 9 clamps and fixes the tool protection sheet 10, and the pressurizing/heating tool 11 brings the height of the bump 2 of the semiconductor chip 1 close to a desired value. The closed space 14 is expanded in a space surrounded by the pressurizing/heating tool 11, the sheet fixing jig 9, and the wiring board 6 to expand the pressurizing film 10b, the insulating resin film 5 protruding from the end of the semiconductor chip 1 to form the fillet portion 19 is laterally pressurized and cured, and the insulating resin film 5 is cured while an inner pressure with the insulating resin film 5 under the semiconductor chip 1 being pressurized and heated is controlled by an external pressure by the pressurizing film 10b. The deformation load of the bump 2 is about 50 g per bump. The load is controlled depending on the size of the bump 2, and in this case, the bump height is 25 μmt in view of reliability. As required, the pressurizing/heating stage 8 may be heated or cooled to control the inner pressure applied to the insulating resin film 5 to suppress generation of a void.

FIG. 8(d) shows a flip-chip mounting body obtained by releasing the pressurizing/heating tool 11 after the insulating resin film 5 is cured by the external pressure by the pressurizing film 10b.

Herein, the procedure in FIG. 7(b) is performed to apply the UV light 17 to the tool protection sheet 10, and then the workpiece shown in FIG. 1(c) is conveyed and attached to the pressurizing/heating stage 8, but the step of conveying and attaching the workpiece to the pressurizing/heating stage 8 and the step of applying the UV light 17 to the tool protection sheet 10 may be concurrently performed to reduce production tact.

As described above, pressurizing and heating with the thin tool protection sheet 10 allow heat to be easily transferred to the semiconductor chip 1 and its surrounding area and allow the insulating resin film 5 to be cured, and the thin tool protection sheet 10 allows the pressurizing/heating tool 11 to apply an even load in a parallel fashion from above to and pressurize the semiconductor chip 1. Further, the insulating resin film 5 can be cured in a short lead time. Moreover, the closed space 14 is vaporized and expanded, and thus the pressurizing film 10b can be pressed against the insulating resin film 5 to apply the external pressure to and cure the insulating resin film 5. The tool protection sheet 10 is a thin sheet and flexibly bendable in contrast to rubber, and the fillet portion 19 of the insulating resin film 5 around the semiconductor chip 1 can be reduced to suppress the generation of a void.

Embodiment 5

FIGS. 1, 9, 10, 11A, 11B, 12A, 12B and 13 show Embodiment 5 of the present invention.

In Embodiment 4, the tool protection sheet 10 has the two-layer film structure made up of the base film 10a and the pressurizing film 10b, the UV curable adhesive 15 is formed between the base film 10a and the pressurizing film 10b, and the base film 10 is a light blocking film and the pressurizing film 10b is an UV transmissive film. A tool protection sheet 10 of Embodiment 5 shown in FIGS. 9, 10(a) and 10(b) has a three-layer film structure made up of a base film 10a, a pressurizing film 10b, and a shield film 18, an UV curable adhesive 15 is formed between the base film 10a and the pressurizing film 10b, and the individual shield film 18 is bonded to the outer surface of the pressurizing film 10b by a weak adhesive layer 24. The shield film 18 may be, for example, a heat-resistant resin film, such as polyimide resistant to a maximum temperature during the process, on which metal such as aluminum is deposited. The base film 10a is formed of a UV transmissive film. Such a tool protection sheet 10 is held by a sheet fixing jig 9. FIG. 10(a) is a plan view of the tool protection sheet 10 seen from the side of the base film 10a, and FIG. 10(b) is a side view of FIG. 10(a).

Figure 9:
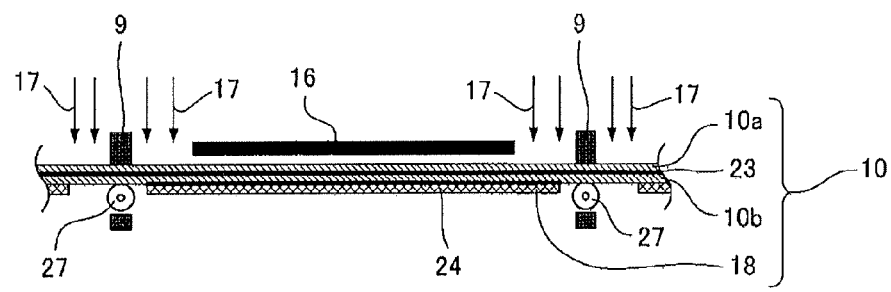
FIG. 9 is a sectional view of a tool protection sheet used in Embodiment 5 of the flip-chip mounting method according to the present invention.
Figure 10:
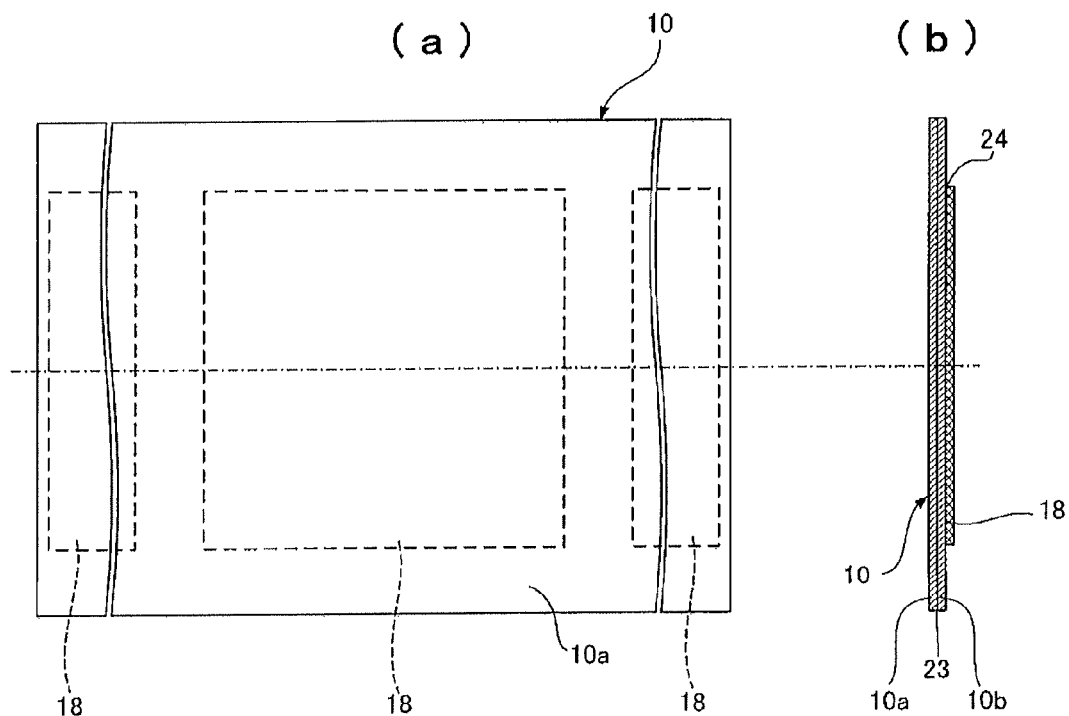
FIG. 10 is a plan view and a side view of the tool protection sheet used in Embodiment 5.

In FIG. 9, a light blocking mask 16 is provided in a portion for substantially heating and pressurizing a semiconductor chip 1 on the side of the base film 10a of the tool protection sheet 10, and UV light 17 is applied from the side of the base film 10a to reduce adhesion between the base film 10a and the pressurizing film 10b. An UV-cutoff light blocking film may be used on the side of the pressurizing film 10b so that the pressurizing film 10b is not exposed to light. The tool protection sheet 10 is configured so that only a portion used for heat pressurization is exposed from a guide (not shown) provided in the sheet fixing jig.

Figure 11A:
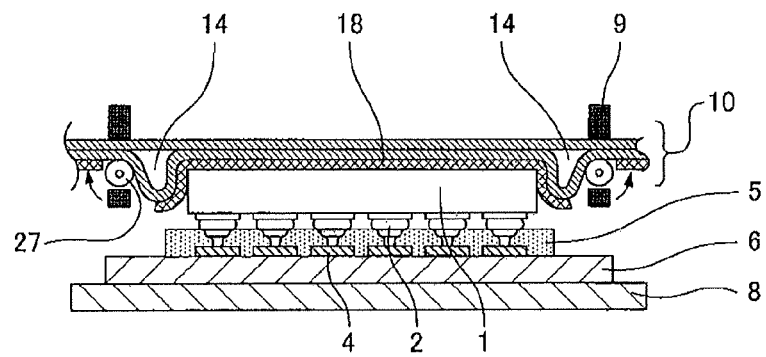
FIG. 11A is a sectional view of a first step of a downstream process of Embodiment 5.

In FIG. 11A, the workpiece shown in FIG. 1(c) is conveyed to a pressurizing/heating stage 8, and the back surface of a wiring board is attached to the pressurizing/heating stage 8. The tool protection sheet 10 including the shield film 18 shown in FIG. 9 is aligned and provided above the semiconductor chip 1.

Next, the side of the pressurizing film 10b of the tool protection sheet 10 is released by the sheet fixing jig 9 to provide slack in the pressurizing film 10b. Specifically, the pressurizing film 10b is easily released from the base film 10a with an adhesive force reduced by the application of the UV light 17, and a roller 27 of the sheet fixing jig 9 is rotated toward the semiconductor chip 1 to release, wind and draw the pressurizing film to provide slack in the film toward the middle of the tool protection sheet 10. The thickness or adhesive force of the UV curable adhesive may be selected and controlled so that a closed space is easily formed by the film releasing operation of the sheet fixing jig 9.

Figure 11B:
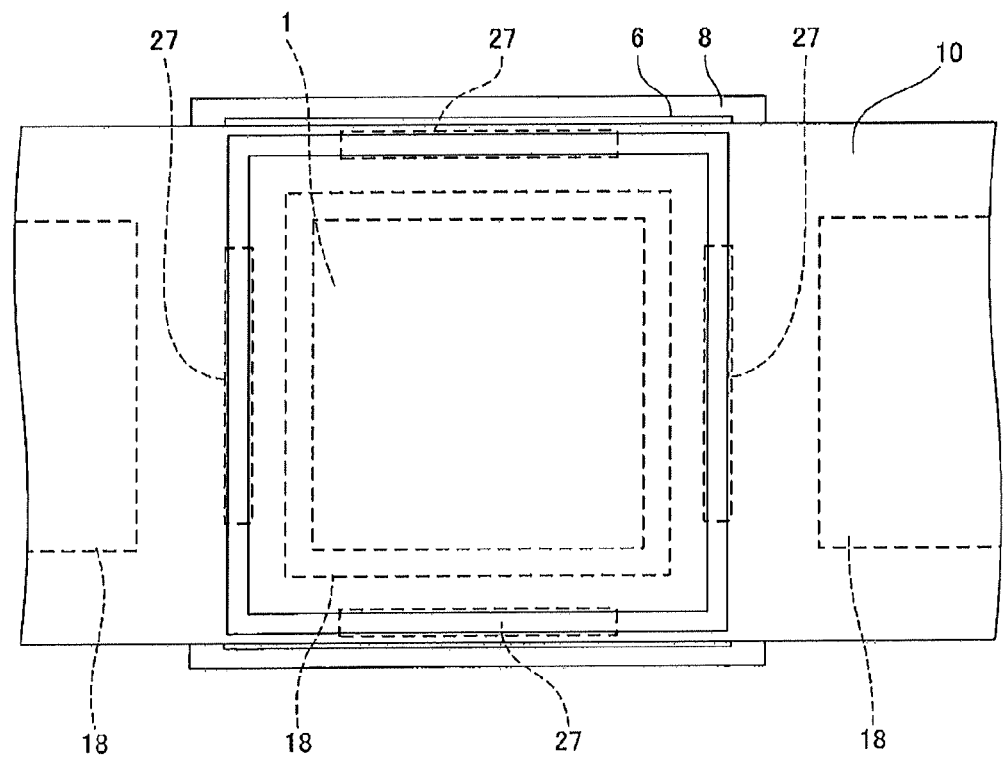
FIG. 11B is a plan view of the first step of the downstream process of Embodiment 5.

The pressurizing film 10b is released by rotating the roller 27 of the sheet fixing jig 9 after a pressure is stably applied about 0.1 seconds after the pressurizing film 10b comes into contact with the semiconductor chip 1. FIG. 11B shows a plan view of FIG. 11A. In this embodiment, four rollers 27 of the sheet fixing jig 9 are placed so as to surround the outer periphery of the semiconductor chip 1. The same applies to the roller 27 of the sheet fixing jig 9 in Embodiment 4.

Figure 12A:
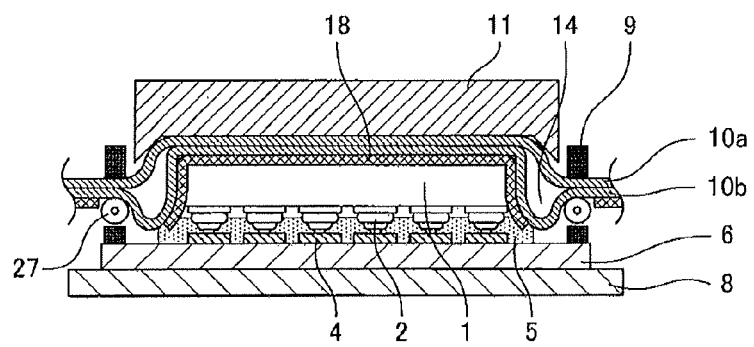
FIG. 12A is a process diagram of the downstream process of Embodiment 5.

Then, in FIG. 12A, the sheet fixing jig 9 clamps and lowers the tool protection sheet 10 so as to be in contact with the semiconductor chip 1, and the pressurizing/heating tool 11 presses and holds the tool protection sheet 10 against the semiconductor chip 1 to pressurize and heat the semiconductor chip 1. The slack in the pressurizing film 10b is formed as a bulge around the semiconductor chip 1.

The pressurizing/heating tool 11 applies a load, so that all bumps 2 pierce an insulating resin film 5 and are deformed in contact with a terminal electrode 4 on a wiring board 6. The tool protection sheet 10 is inclined to near the wiring board 6 by the sheet fixing jig 9.

At this point, it is preferable that the outer periphery of the pressurizing/heating tool 11 is inclined toward the insulating resin film 5 to form a fillet portion 19 around the semiconductor chip 1 as shown in FIG. 12A. Inclination 26 is provided to allow heat from the pressurizing/heating tool 11 to be more quickly transferred to the tool protection sheet 10.

The pressurizing/heating tool 11 is brought close to or into contact with the tool protection sheet 10 to heat the tool protection sheet 10, so that a closed space 14 between the base film 10a and the pressurizing film 10b is heated by heat from the pressurizing/heating tool 11 and expanded, and the shield film 18 is pressed against and bonded to the fillet portion 19.

Figure 12B:
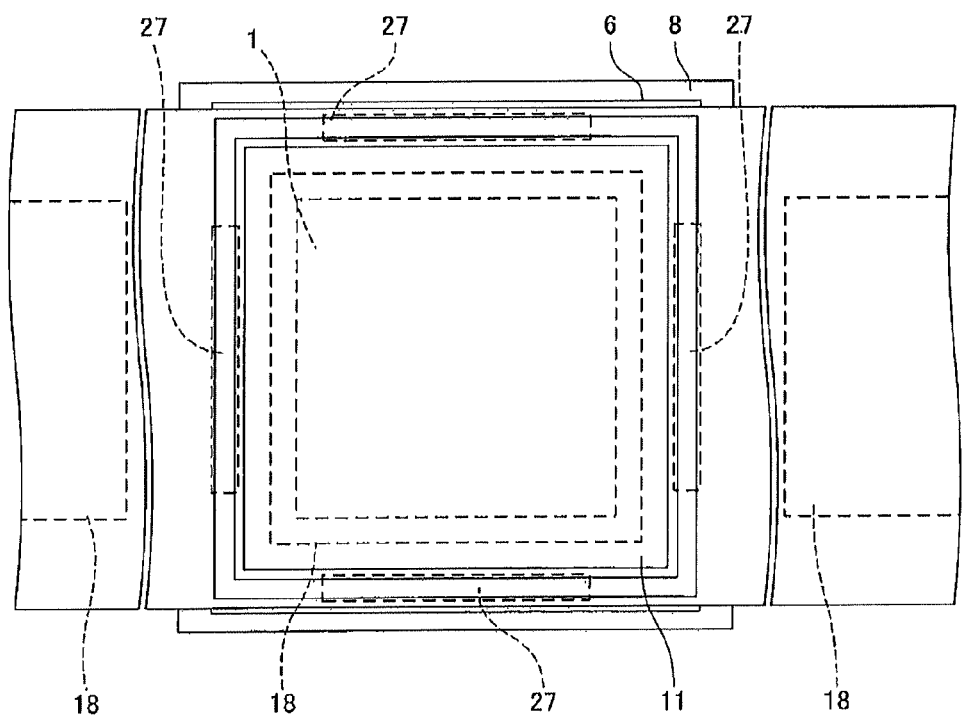
FIG. 12B is a process diagram of the downstream process of Embodiment 5.
Figure 13:
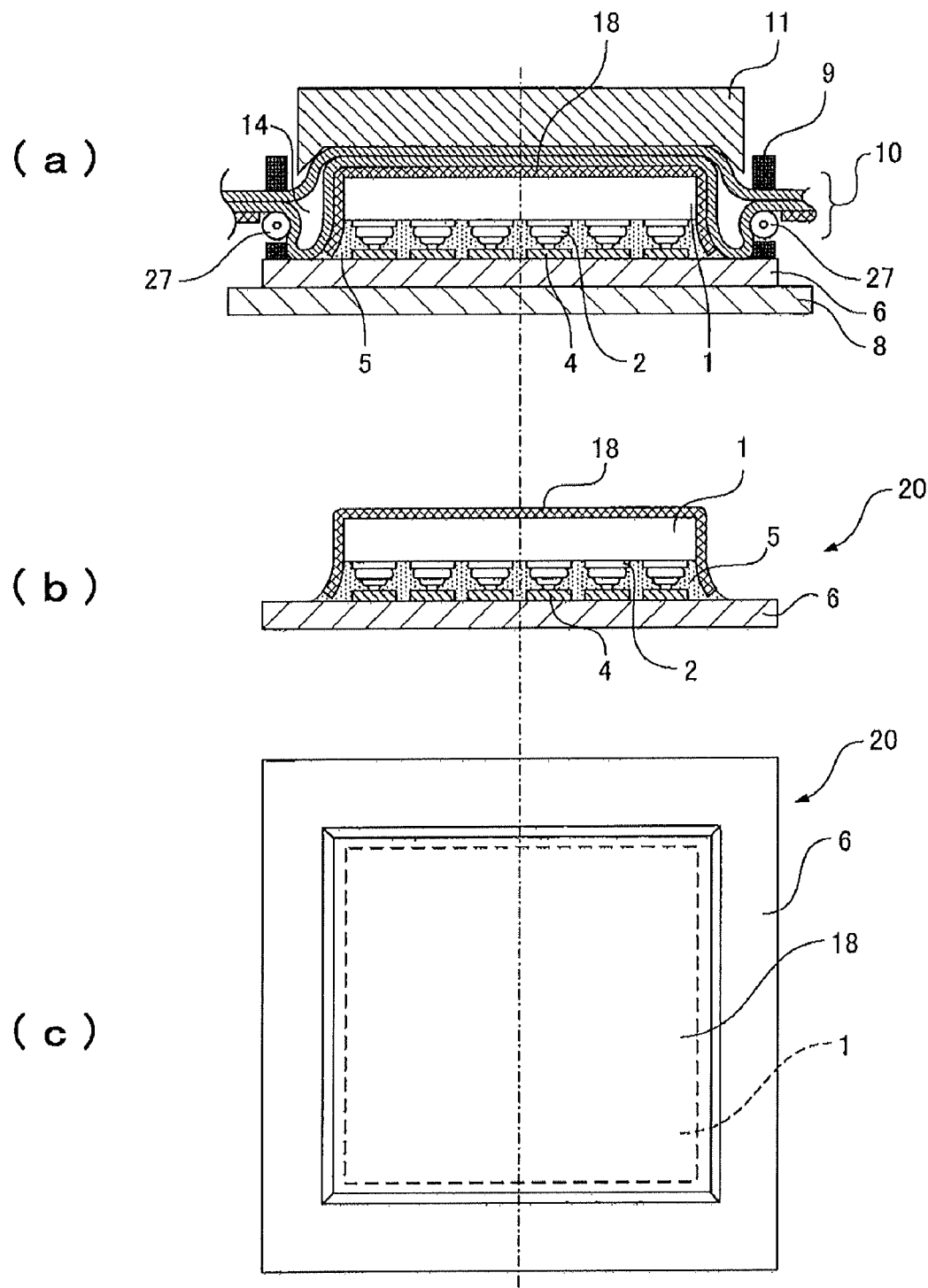
FIG. 13 is a process diagram of the downstream process of Embodiment 5.
Figure 14:
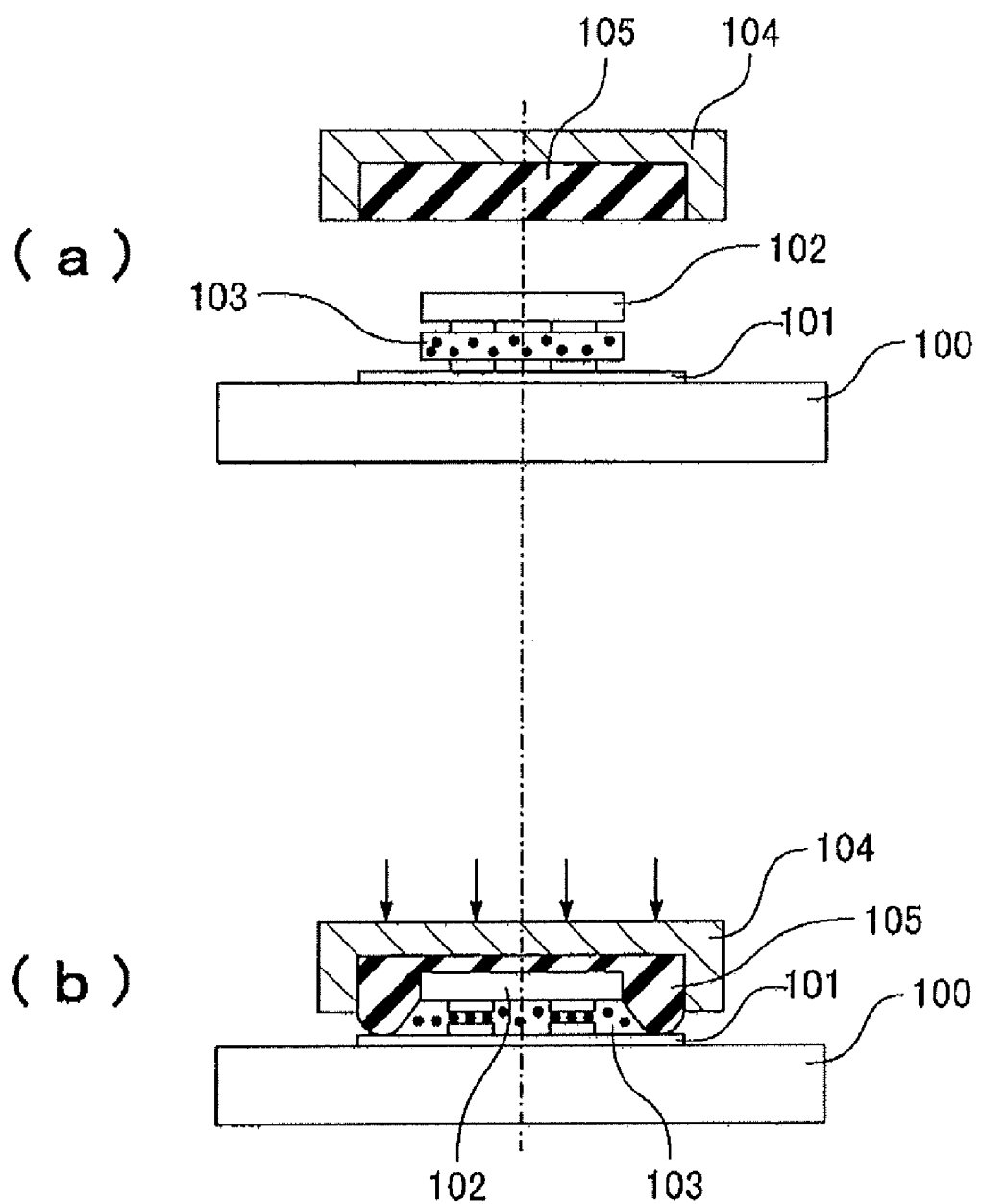
FIG. 14 is a process diagram of a mounting method of the prior art example.

Further, the closed space 14 that is the slack in the pressurizing film 10b is further thermally expanded, so that the pressurizing film 10b is expanded in a space surrounded by the pressurizing/heating tool 11, the sheet fixing jig 9, and the wiring board 6, the insulating resin film 5 protruding from the end of the semiconductor chip 1 is laterally pressed while the fillet portion 19 of the semiconductor chip 1 is pressurized by the shield film 18, and the insulating resin film 5 is cured while an inner pressure with the insulating resin film 5 under the semiconductor chip 1 being pressurized and heated is controlled by an external pressure by the pressurizing film 10b. FIG. 12B is a plan view of FIG. 12A.

In FIG. 13(a), the pressurizing/heating tool 11 is further lowered to heat the tool protection sheet 10, and thus the closed space 14 between the base film 10a and the pressurizing film 10b is further thermally expanded. The sheet fixing jig 9 clamps and fixes the tool protection sheet 10, and the pressurizing/heating tool 11 brings the height of the bump 2 of the semiconductor chip 1 close to a desired value. The closed space 14 is expanded in the space surrounded by the pressurizing/heating tool 11, the sheet fixing jig 9, and the wiring board 6 to expand the pressurizing film 10b, the shield film 18 presses against the fillet portion 19 protruding from the end of the semiconductor chip 1, and the shield film 18 laterally pressurizes, presses and bonds to the insulating resin film 5 so as to be partially embedded in the insulating resin film 5. The insulating resin film 5 is cured while the inner pressure with the insulating resin film 5 under the semiconductor chip 1 being pressurized and heated is controlled by the external pressure by the pressurizing film 10b. The deformation load of the bump 2 is about 50 g per bump. The load is controlled depending on the size of the bump 2, and in this case, the bump height is 25 µmt in view of reliability. As required, the pressurizing/heating stage 8 may be heated or cooled to control the inner pressure applied to the insulating resin film 5 to suppress generation of a void.

FIG. 13(b) is a sectional view showing a flip-chip mounting body in which the insulating resin film 5 is cured by the external pressure by the pressurizing film 10b, and the semiconductor ship obtained by releasing is covered with the shield film 18. FIG. 13(c) is a plan view of FIG. 13(b).

As described above, pressurizing and heating with the thin tool protection sheet 10 allow heat to be easily transferred to the semiconductor chip 1 and its surrounding area and allow the insulating resin film 5 to be cured, and the thin tool protection sheet 10 allows the pressurizing/heating tool 11 to apply an even load in a parallel fashion from above to and pressurize the semiconductor chip 1. Further, the insulating resin film 5 can be cured in a short lead time. Moreover, the closed space 14 is vaporized and expanded, and thus the pressurizing film 10b can be pressed against the insulating resin film 5 to apply the external pressure to and cure the insulating resin film 5. The tool protection sheet 10 is a thin sheet and flexibly bendable in contrast to rubber, and the fillet portion 19 of the insulating resin film 5 around the semiconductor chip 1 can be reduced to suppress the generation of a void.

A metal-coated shield film 18 can block electromagnetic waves or the like, and a shield film 18 of resin can provide a flip-chip mounting structure including the upper and side surfaces of the semiconductor chip which has high reliability against an external force or adverse environments.

The base film 10a is desirably a heat-resistant film. For example, polyimide, polyphenylene sulfide, fluororesin and the like are desirable. The pressurizing film 10b is also desirably a heat-resistant film (NCF curing temperature or more). For example, polyimide, polyphenylene sulfide, fluororesin and the like are desirable. The base film 10a and the pressurizing film 10b have a thickness of about 5 to 10 µm.

The shield film 18 may be an insulating metal thin film or an insulating-coated conductive metal thin film. Further, in addition to electric shielding, a resin film having an insulating property, heat resistance, low water absorption or a gas barrier property may be used depending on the intended use and reliability. The resin film is used to increase reliability in mechanical properties by heat or stress and in moisture resistance other than bonding between the semiconductor chip 1 and the insulating resin film 5.

In Embodiment 5, the pressurizing film 10b is partially released in FIG. 11A, but this process is preferably performed before the process of conveying and attaching the workpiece to the pressurizing/heating stage 8 to reduce a process tact.

In Embodiment 5, the UV curable adhesive 15 is provided between the base film 10a and the pressurizing film 10b, but a low tack adhesive may be provided instead of the UV curable adhesive 15.

In Embodiment 5, the shield film 18 is bonded to the pressurizing film 10b by the weak adhesive layer 24, but the shield film 18 may be bonded to the pressurizing film 10b by static electricity.

In each of the embodiments, in the process of forming the closed space, the material sealed therein is simply thermally expanded, but the material sealed therein may be thermally expanded and a gas may be forcedly injected to control the size and growth of the closed space.

In Embodiment 5, the shield film 18 is bonded to the side of the tool protection sheet 10, and the shield film 18 is moved to the semiconductor chip 1. A finished shape very similar to that in Embodiment 5 may be also achieved by bonding the shield film 18 onto the semiconductor chip 1 via low tack resin and thermally pressurizing the semiconductor chip 1 with the tool protection sheet 10 as in Embodiments 1 to 4.

Industrial Applicability

The present invention can be used in a small and thin semiconductor apparatus or the like having a semiconductor device flip-chip mounted on a multilayer circuit board.

The invention claimed is:

1. A flip-chip mounting method, comprising, when placing thermosetting underfill resin between a semiconductor chip and a wiring board and flip-chip mounting the semiconductor chip on the wiring board:
    pressurizing and heating the semiconductor chip positioned with the thermosetting underfill resin placed between the wiring board and the semiconductor chip, from an upside of a tool protection sheet having a two-layer film structure made up of a base film and a pressurizing film;
    separating the pressurizing film from the tool protection sheet other than a pressurizing portion immediately above the semiconductor chip while curing the underfill resin under the semiconductor chip; and
    expanding the separated pressurizing film to abut against the underfill resin around the semiconductor chip and cure the underfill resin while pressurizing and heating the underfill resin to fix the semiconductor chip to the wiring board.

2. The flip-chip mounting method according to claim 1, wherein the tool protection sheet seals one or more of a solid, a liquid, and a gas between the base film and the pressurizing film.

3. A flip-chip mounting method, comprising, when placing thermosetting underfill resin between a semiconductor chip and a wiring board and flip-chip mounting the semiconductor chip on the wiring board:
    pressurizing and heating the semiconductor chip positioned with the thermosetting underfill resin placed between the wiring board and the semiconductor chip, from an upside of a tool protection sheet having a three-layer film structure made up of a base film, a pressurizing film, and a shield film bonded to the pressurizing film;
    separating the pressurizing film from the tool protection sheet other than a pressurizing portion immediately above the semiconductor chip while curing the underfill resin under the semiconductor chip;
    expanding the separated pressurizing film to abut against the underfill resin around the semiconductor chip via the shield film and cure the underfill resin while pressurizing and heating the underfill resin to fix the semiconductor chip to the wiring board; and
    bonding the shield film on a side of the semiconductor chip.

4. The flip-chip mounting method according to claim 3, wherein the tool protection sheet seals one or more of a solid, a liquid, and a gas between the base film and the pressurizing film.

5. A flip-chip mounting apparatus for placing thermosetting underfill resin between a semiconductor chip and a wiring board and flip-chip mounting the semiconductor chip on the wiring board, the flip-chip mounting apparatus comprising:
    a sheet fixing jig for holding a tool protection sheet having a two-layer film structure made up of a base film and a pressurizing film or a three-layer film structure made up of a base film, a pressurizing film, and a shield film bonded to the pressurizing film, and covering the semiconductor chip positioned with the thermosetting underfill resin placed between the wiring board and the semiconductor chip and an area around the semiconductor chip; and
    a pressurizing/heating tool for heating and pressing the semiconductor chip against the wiring board, the pressurizing/heating tool having a protrusion for pressing the tool protection sheet between an inner peripheral portion of the sheet fixing jig and an outer peripheral portion of the semiconductor chip against an outer peripheral portion of the thermosetting underfill resin.

* * * * *